United States Patent
Yang

[19]

[11] Patent Number: 6,103,430
[45] Date of Patent: Aug. 15, 2000

[54] METHOD FOR REPAIRING BUMP AND DIVOT DEFECTS IN A PHASE SHIFTING MASK

[75] Inventor: Baorui Yang, Pflugerville, Tex.

[73] Assignee: Micron Technology, Inc., Boise, Id.

[21] Appl. No.: 09/223,000

[22] Filed: Dec. 30, 1998

[51] Int. Cl.$^7$ ...................................................... G03F 9/00
[52] U.S. Cl. ................................................................ 430/5
[58] Field of Search ...................... 430/5, 322; 250/310; 382/144

[56] References Cited

U.S. PATENT DOCUMENTS

| | | | |
|---|---|---|---|
| 5,357,116 | 10/1994 | Talbot et al. | 250/492.21 |
| 5,382,484 | 1/1995 | Hosono | 430/5 |
| 5,405,734 | 4/1995 | Aita | 430/5 |
| 5,582,939 | 12/1996 | Pierrat | 430/5 |
| 5,717,204 | 2/1998 | Meisburger et al. | 250/310 |
| 5,981,110 | 11/1999 | George et al. | 430/5 |

Primary Examiner—S. Rosasco
Attorney, Agent, or Firm—Dickstein Shapiro Morin & Oshinsky, LLP

[57] ABSTRACT

A method for repairing bump and divot defects in phase shifting masks is performed by first identifying the locations of defects. Then, whether the defect is in a phase shift well or non-phase shift area is determined. The mask is then coated with photoresist. The immediate area surrounding each defect to be repaired (depending upon whether the defect is in a phase shift well or non-phase shift area), is then exposed to ultraviolet light. Additional defects are then identified and corresponding areas of the resist exposed. The resist is then developed such that the defect areas are not covered by the resist. Then SOG (spin on glass) material is deposited in the defect areas. The thickness of the SOG material at the areas to be repaired is measured. The SOG material is then etched to the surface of the substrate, thereby repairing both bump and divot defects. The process is performed in two iterations in which defects in a first type of area (phase shift or non-phase shift) are repaired in the first iteration and the remaining defects are repaired in the second iteration. The process may be performed using an optical microscope with yellow and ultraviolet light filters and an adjustable field aperture.

34 Claims, 4 Drawing Sheets

METHOD FOR REPAIRING BUMP AND DIVOT DEFECTS IN A PHASE SHIFTING MASK

BACKGROUND OF THE INVENTION

1. Field of the Invention

The present invention relates generally to the field of integrated circuit fabrication, and more specifically to a method for repairing bump and divot defects in a phase shifting mask that does not require the classification of the defect as either a bump or divot defect.

2. Description of the Related Art

In the manufacture of semiconductor wafers, microlithography is used to pattern various layers on a wafer. A layer of resist is deposited on the wafer and exposed using an exposure tool and a template such as a mask or reticle (as used herein, "mask" shall refer to templates of any kind including masks and reticles). During the exposure process a form of radiant energy, such as ultraviolet light, is directed through the mask to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

An individual reticle can cost up to $20,000 and typically requires up to two weeks to manufacture. Mask production likewise involves substantial time and expense. The complete circuit patterning for a modern IC will typically require 10 to 20 or more reticles, and the ability to repair a reticle or mask quickly saves turnaround time and cost.

An example of a traditional mask 10 is shown in FIG. 1. The mask 10 is formed on a transparent substrate 12 such as quartz. Opaque material 14 such as Chromium (Cr) is deposited on the substrate 12 to form a pattern of alternating opaque areas 14 and clear areas 13. As shown in FIG. 1, the width W of the clear areas 13 is equal to the width W of the opaque areas 14. The minimum width W of the alternating areas 13, 14 is referred to as the line width or feature size.

As the semiconductor manufacturers attempt to decrease the size of integrated circuits, the line width naturally continues to shrink. One known problem with conventional masks is that diffraction causes the light pattern transmitted throughout the mask to "blur." This problem is particularly acute as the line width reaches submicron levels. This problem has led to the use of phase shifting masks.

Phase shifting masks shift (usually by 180 degrees) the phase of light transmitted through every other clear area. The phase shift is accomplished by providing phase shift areas, or wells, in every other clear area. The wells may be provided in different ways. For example, FIG. 2 illustrates a phase shifting mask 100 including a substrate 12 into which phase shifting wells 16 have been etched. The phase shifting wells 16 correspond to every other clear area 13. Thus, the light transmitted through the mask 100 on one side of an opaque area 14 is phase-shifted with respect to the light transmitted through the mask 100 on the other side of the opaque area 14. As used herein, the term "non-phase shift area" refers to a clear area that is not in a phase shift well, while the terms "phase shift area" and "phase shift well" refer to a clear area that is recessed with respect to non-phase shift areas. FIG. 3 illustrates a second type of phase shifting mask 200. Rather than etching phase shifting wells into the substrate 12, a transparent material 18 is provided on top of the substrate 12 in all areas except every other clear area 13. Thus, each opaque area 14 and every other clear area 17 are on the transparent material 18, while the remaining clear areas 13 are formed in phase shifting wells 16 in which no transparent material 18 is present. The discussion herein will focus on the type of phase shifting mask 100 illustrated in FIG. 2, although those of skill in the art will readily recognize that the discussion and invention are equally applicable to the type of phase shifting mask 200 illustrated in FIG. 3.

FIG. 4 illustrates bump and divot defects in a phase shifting mask 100. It should be noted that the defects that are being discussed herein (sometimes referred to as clear area defects) are different from defects in the opaque areas 14 such as the clear and opaque defects discussed in my co-pending application entitled "Method for Removing the Carbon Halo Caused by FIB Clear Defect Repair of a Photomask," Ser. No. 09/190,057, filed Nov. 12, 1998. FIG. 4 illustrates a phase shift well 16 with a bump defect 20, as well as a phase shift well 16 with a divot defect 22. FIG. 4 also illustrates a divot defect 22 in non-phase shift clear area 17. Bump defects do not occur in the non-phase shift area in the type of phase shifting mask 100 illustrated in FIGS. 2 and 4, but may occur in the type of phase shifting mask 200 illustrated in FIG. 3 depending upon the flatness of the coated transparent material areas 18.

Methods of correcting bump and divot defects in phase shifting masks are taught in U.S. Pat. No. 5,382,484 (the "'484 patent"). The methods taught therein, however, suffer from drawbacks which make their use relatively difficult and expensive in practice. First, the methods taught by the '484 patent require the identification of the type of defect (i.e. bump or divot) in addition to identifying the existence of the defect. Although the presence of a clear area defect can often be detected with an optical mask inspection tool, in practice the identification of the type of defect often requires the use of a device such as a SEM or an AFM. Second, the methods taught by the '484 patent require tools such as FIBs (focused ion beam) and laser tools. Use of both of these tools adds to the cost and complexity of repairing defects in masks, as well as adding the risk that the mask substrate or opaque areas will be damaged by the FIB or laser tool used in the repair process.

What is needed is a method of repairing bump and divot defects in phase shifting masks that can be performed without requiring the identification of the type of defect and without requiring the use of expensive and complex tools which may damage the mask.

SUMMARY OF THE INVENTION

The present invention provides a method for repairing bump and divot defects in phase shifting masks that does not require the identification of the type of defect (i.e. bump or divot) or the use of special tools, such as FIBs or lasers, which may damage the substrate. In a preferred embodiment, the method is carried out with the aid of an optical microscope equipped with a light source that produces light at a wavelength that does not expose resist (yellow in the preferred embodiment), and light that exposes resist (ultraviolet in the preferred embodiment), a first filter for filtering all light other than non-exposing light from the light source, a second filter for filtering all light other than exposing light from the light source, and an adjustable field aperture. Preferably, the microscope includes a shutter to facilitate changing from the first filter to the second filter.

The defect may be positioned to a desired location by a computer file containing desired coordinates. If defects are present only in phase shift wells or only in non-phase shift areas, all defects may be repaired in one iteration of the process described below. However, if defects are present in both phase shift wells and non-phase shift areas, two iterations will be necessary.

The method is performed by first identifying the locations of all defects. In the preferred embodiment, this step is accomplished with a standard automated mask inspection tool that creates a computer file that lists all defect locations. Next, the type of area (i.e. phase shift area or non-phase shift area) each defect is in is determined. This step is performed using an optical microscope in the preferred embodiment. Preferably, the computer file that holds the defect locations is modified to include an indication of the type of defect area. The type of area (phase shift or non-phase shift) in which defects are to be repaired is then determined. The mask is then cleaned and re-coated with photoresist. For each defect to be repaired (depending upon whether the defect is in a phase shift area or non-phase shift area), the defect and immediately neighboring areas are selectively exposed to ultraviolet light. In the preferred embodiment, this step is accomplished by adjusting the field aperture of the microscope such that the defect and immediately neighboring areas are encompassed in the field with the first filter installed, then replacing the first (yellow) filter with the second (ultraviolet) filter such that the resist in the field is exposed to ultraviolet light from the microscope. The yellow filter is then replaced.

Additional defects are then identified and corresponding areas of the resist exposed. The resist is then developed such that the defect areas are not covered by the resist. Then a repair material is deposited in the defect areas. In the preferred embodiment, the repair material is SOG (spin on glass). The mask is then heated to cure the SOG material and the thickness of the SOG material at the areas to be repaired is measured. The SOG material is then etched to the surface of the substrate. Finally, the resist is stripped. If defects are present in both phase shift areas and non-phase shift areas, the above process is repeated for the defects not repaired in the first iteration.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

The present invention will be illustrated through the description of a method for repairing bump and divot defects in the phase shift areas of a phase shifting mask of the type with phase shift wells etched into a substrate. Numerous specific details are set forth in order to provide a thorough understanding of the present invention. It will be obvious, however, to one skilled in the art that the present invention is capable of many different embodiments and that the present invention may be practiced without the specific details set forth herein. Accordingly, the drawings and description herein are to be regarded as illustrative in nature and not as restrictive.

In the preferred embodiment, the following method is carried out with the use of an optical microscope that is equipped with an adjustable field aperture, a light source that transmits light at a wavelength that does not expose photoresist, which is typically yellow light (with a first wavelength of approximately 575 nm) and light that does expose photoresist, preferably with good resolution, such as ultraviolet light (with a second wavelength of approximately 365 nm); and yellow (first) and utlraviolet (second) filters. The specific wavelengths are chosen depending upon the type of photoresist such that the light of the first wavelength does not expose the resist and the light of the second wavelength does expose the resist. The light source illuminates only the field encompassed by the adjustable field aperture. The yellow filter filters out all light except yellow light, which will not expose photoresist but is sufficient to illuminate a sample such that its features are discernible to the human eye. The yellow filter may be exchanged with the ultraviolet filter during operation such that ultraviolet light from the light source impinges in the area encompassed by the field aperture. Thus, the optical microscope may be used both to view a photoresist-covered sample in areas in which the photoresist has not been developed (undeveloped photoresist is transparent) and to selectively expose areas of a photoresist-covered sample. The use of this ability is described in detail below. However, it will be apparent to those skilled in the art that numerous other methods may be employed to selectively expose areas of photoresist in this manner. For example, rather than using filters with a single light source that produces light with both yellow and ultraviolet components, separate yellow and ultraviolet light sources may be selectively switched in and out to selectively expose the desired photoresist areas and view the sample.

Figure 5:
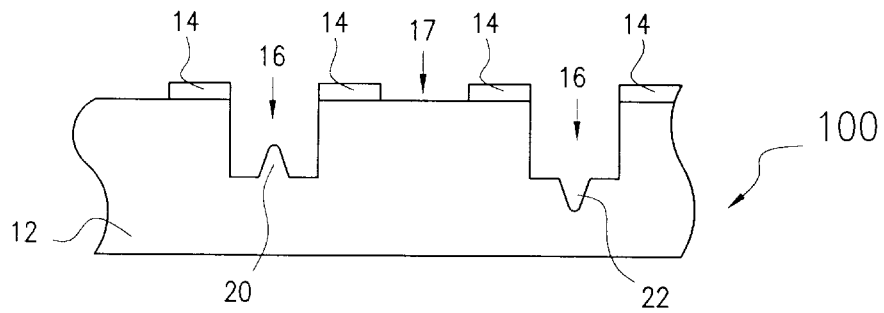
FIG. 5 is a cross-sectional diagram of a portion of a phase shifting mask with bump and divot defects in phase shift wells.

Referring now to the drawings, where like elements are designated by like reference numerals, a cross-sectional view of a quartz phase shifting mask 100 having both a bump defect 20 and a divot defect 22 in phase shift wells 16 is illustrated in FIG. 5. The mask 100 is first inspected and the locations of defects noted. Preferably, the defects are located with an automatic optical mask inspection tool, such as a KLA-351 mask inspection tool. Such a tool will produce a computer file that lists the coordinates of the location of the defects.

Next, the mask is examined to determine whether the defects are in a phase shift area or a non-phase shift area. Preferably, this step is accomplished using the aforementioned microscope. Neither the yellow nor the ultraviolet filter need be installed at this point as the mask 100 has not yet been coated with photoresist. If a computer file with defect locations has been prepared, this file may be used to position the microscope over the defects. As mentioned above, it is possible to determine the type of area the defect is in (as opposed to the type of defect) with an optical microscope. For example, when phase shift wells are etched into the substrate of a phase shifting mask, the AR (anti-reflective) coating on the Cr edges are slightly "damaged," thus making the edges adjacent to phase shift wells appear "brighter" than the edges adjacent to non-phase shift areas. Preferably, the computer file is updated to indicate the type of area (phase shift or non-phase shift) in which each defect is located.

Figure 6:
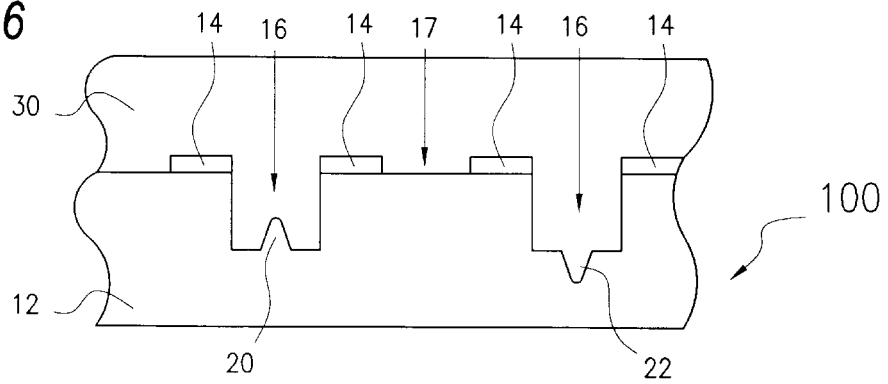
FIG. 6 is a cross-sectional diagram of the portion of the phase shifting mask of FIG. 5 at an early stage in a repair process according to one embodiment of the present invention.

The next step is to determine whether defects are to be repaired in phase shift areas or non-phase shift areas. Only defects in one type of area may be repaired in any one iteration of the repair process for reasons more fully explained below. Obviously, if defects are only present in one type of area (such as when only a single defect is to be repaired), that type of area is chosen. If defects are present in both types of areas, then either type of area could be chosen first; the order in which the defects are repaired is not important. If a computer file has been prepared as detailed above, and defects are present in both types of areas, a filter file can be set on the microscope system to select only one type of defect according to the defect classification. As shown in FIG. 6, both defects 20, 22 are in phase shift wells 16; therefore, both defects may be repaired in the current iteration and the coordinates of both defects 20, 22 will be included in the filtered computer file used for the current iteration.

Once the defects to be repaired have been determined, the mask 100 is covered with a layer of positive photoresist 30 as shown in FIG. 6. The thickness of the photoresist is then measured to determine the length of time that the photoresist must be exposed to light of the second (preferably ultraviolet) wavelength. It will also be used to determine the end point in the following SiO$_2$ dry etching.

The optical microscope is then positioned over the defects to be repaired with the yellow filter installed. The aperture of the microscope is then adjusted such that the entire defect area is encompassed in the microscope field while encompassing as little of the non-defect areas as possible. However, the aperture adjustment does not have to be exact. It is acceptable if adjacent quartz areas and/or opaque areas are visible in the aperture. For example, if the bump defect 20 of FIG. 6 is to be repaired, the field aperture of the microscope may be adjusted such that portions of adjacent opaque areas 14 and/or portions of substrate to the left, right, front and back of the bump defect 20 are present in the microscope field.

Once the field aperture has been adjusted, the yellow filter is replaced with the ultraviolet filter such that the ultraviolet light impinges on the area containing the bump defect 20, thereby exposing the resist 30 in that area. Care is taken during this step to ensure that no white light impinges upon the defect area or any other area with non-exposed resist 30, as resolution will be lost if the photoresist is developed in white light. After the resist 30 has been exposed for a sufficient time (which depends upon the thickness of the photoresist previously measured), the yellow filter is replaced, again, without exposing any non-exposed resist 30 to white light. Additional defects are then identified and corresponding areas of the resist 30 exposed in the same manner.

Figure 7:
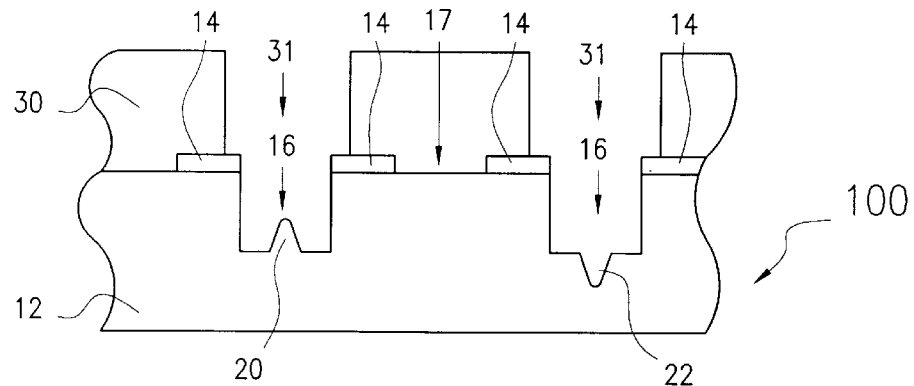
FIG. 7 is a cross-sectional diagram of the portion of the phase shifting mask of FIG. 6 at a later stage of the repair process.
Figure 8A:
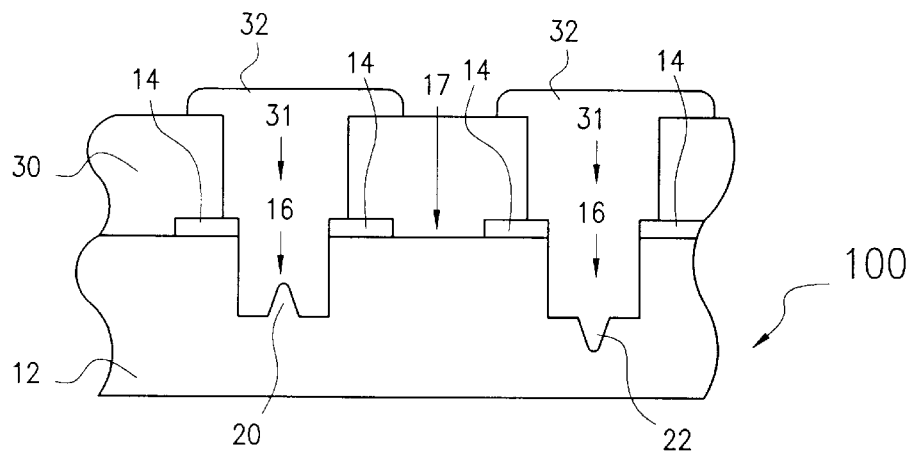
FIG. 8a is a cross-sectional diagram of the portion of the phase shifting mask of FIG. 7 at a later stage of a first variation of the repair process.
Figure 8B:
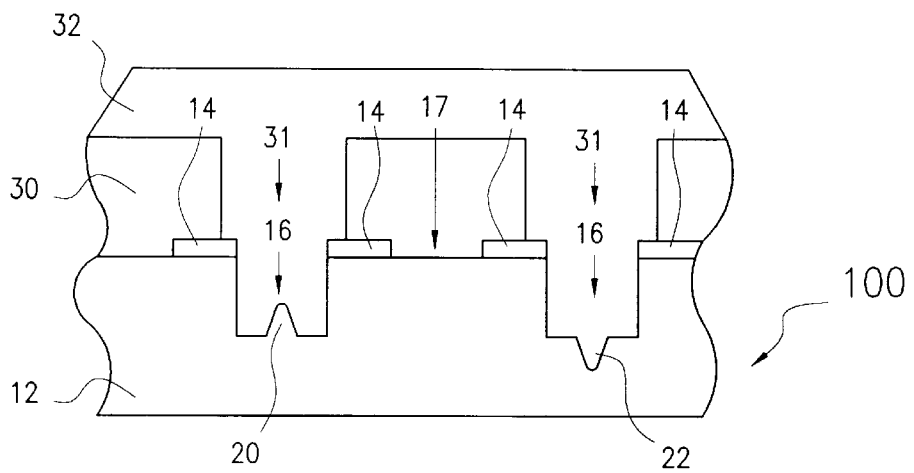
FIG. 8b is a cross-sectional diagram of the portion of the phase shifting mask of FIG. 7 at a later stage of a second variation of the repair process.

The resist 30 is then developed such that the resist 30 is removed from the defect areas to form defect area openings 31 as shown in FIG. 7. Then repair material 32 is deposited in the openings 31. An exemplary repair material is spin-on-glass (SOG) material, which is used in the preferred embodiment. Spin-on-glass material is preferred because it has a refractive index similar to that of quartz, and is easy to work with and inexpensive. The SOG material 32 may be placed directly in the defect area with the use of a submicron diameter capillary (such a capillary has been used for near field laser beam Cr mask repair) as shown in FIG. 8*a*. If this technique is used, it is preferable to deposit "extra" SOG material 32 such that the SOG material 32 extends onto the resist 30 over adjacent Cr areas 14 and is essentially flat and at a uniform thickness over the defect area openings 31. The thickness can be controlled by exposing the same size area over each defect and depositing a fixed amount of SOG material 32 over the defect openings 31. In this case, the thickness of the SOG material 32 over the defect opening 31 will be equal to the depth of the phase shift well 16 plus the thickness of the Cr areas 14 plus the thickness of the resist layer 30 plus the thickness of the SOG material 32 above the resist layer 14. Alternatively, the entire mask 100 may be covered with a bulk SOG material film 32 as shown in FIG. 8*b*. With this method of depositing the SOG material, the thickness of the SOG material 32 over the defect opening 31 will be equal to the depth of the phase shift well 16 plus the thickness of the Cr areas 14 plus the thickness of the resist layer 30 plus the thickness of the bulk SOG material 32 film above the resist layer 14. Note that the thickness of Cr film and the depth of phase shift well were measured during the early processing.

Figure 9:
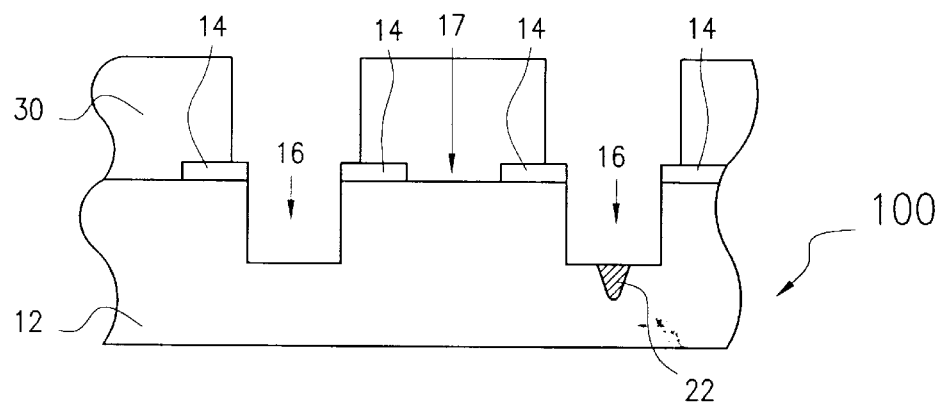
FIG. 9 is a cross-sectional diagram of the portion of the phase shifting mask of FIG. 8 at a later stage of the repair process.
Figure 10:
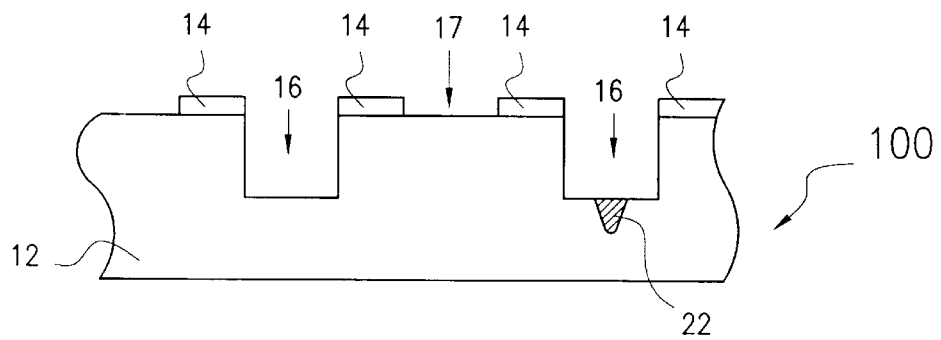
FIG. 10 is a cross-sectional diagram of the portion of the phase shifting mask of FIG. 9 after the repair process is complete.

The mask 100 is then heated to cure the SOG material 32 into a material having properties similar to SiO$_2$. The thickness of the SOG material 32 at the areas to be repaired is measured, preferably with an ordinary optical tool or a profilometer. The SOG material 32 is then selectively etched (with respect to the resist 30 and opaque areas 14) to a target depth equal to the thickness of the SOG material such that all material, including the SOG and any substrate material in the bump defect 20 is removed. The etch time required to reach the target depth may be determined beforehand by simple trial and error if the etch rate is unknown. The etchant is chosen such that it etches the SOG material and the substrate in any bump defects at substantially the same rate. The result is shown in FIG. 9. The bump defect 22 has been removed, while the SOG material has filled in the divot defect 22. Finally, the resist is stripped with a wet process, resulting in the mask 100 shown in FIG. 10. The bump and divot defects 20, 22 have been repaired.

It will be apparent to those of skill in the art that the etch of the SOG material must be controlled such that the proper depth is reached. This depth will vary depending upon whether the defect is in a phase shift area or a non-phase shift area. Accordingly, defects can be replaced in only one type of area for each iteration of the process described above. If defects are present in both phase shift wells and non-phase shift areas, the above process is repeated for the defects not repaired in the first iteration.

Figure 1:
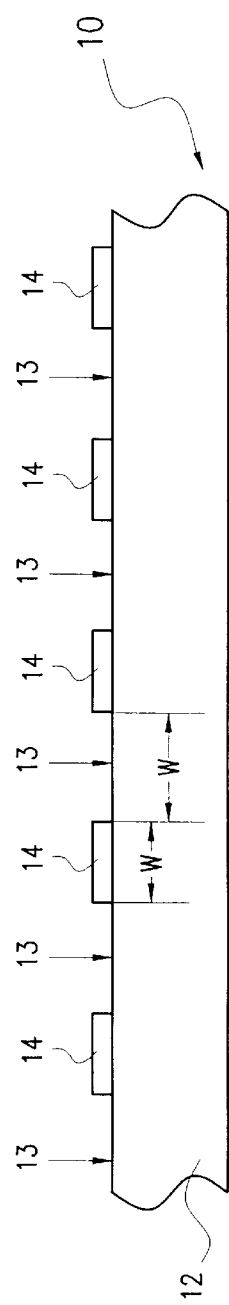
FIG. 1 is a cross-sectional diagram of a portion of a conventional mask.
Figure 2:
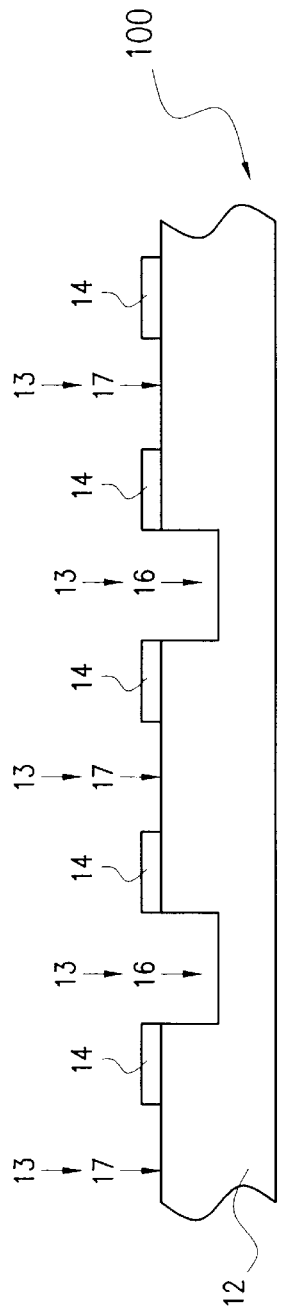
FIG. 2 is a cross-sectional diagram of a portion of a first type of phase shifting mask in which phase shift wells are etched into the substrate.
Figure 3:
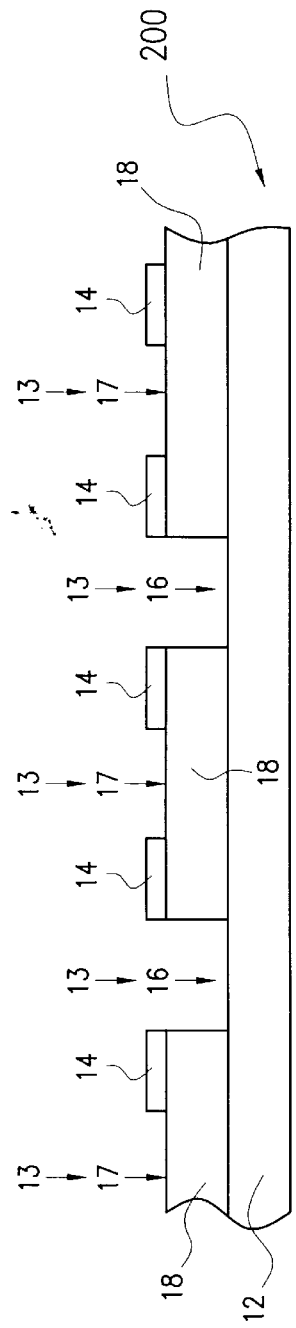
FIG. 3 is a cross-sectional diagram of a portion of a second type of phase shifting mask in which phase shift wells are formed through the addition of transparent material onto the substrate.
Figure 4:
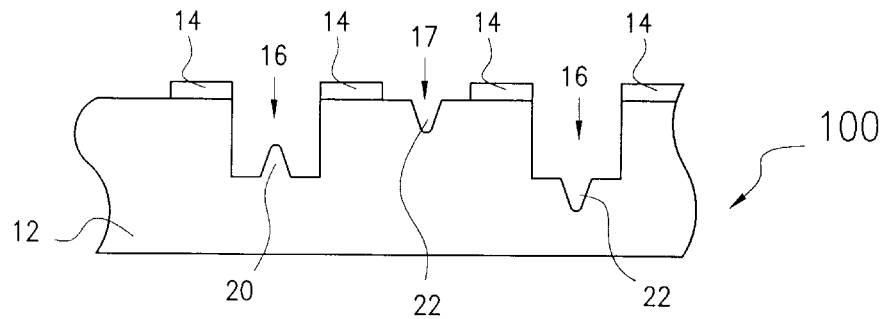
FIG. 4 is a cross-sectional diagram of a portion of a phase shifting mask illustrating bump and divot defects.

As discussed above, it will be apparent to those of ordinary skill in the art that substantially the same process may be used to repair masks of the type shown in FIG. 3. In that case, the etchant must be capable of selectively etching the transparent material 18 used to form the phase shift wells 16 (bump defects will be formed from transparent material 18 improperly left in the phase shift wells 16) as well as the $SiO_2$.

As can be seen from the above discussion, a simple and inexpensive method for repairing a phase shifting mask has been set forth. The method may be accomplished with the use of a simple optical microscope. The method does not require expensive and potentially substrate-damaging tools such as FIB or laser tools. The method does not require the identification of a defect as a bump or divot defect; only the location of the defect need be determined. The method can repair all types of defects at the same time, such as isolated, edge and bridge defects, simple and complicated shape defects. At current line widths, optical microscopes are sufficient to perform these tasks. However, even as line widths decrease to the point at which optical microscopes can no longer serve to identify defects (or whether the defect is in a phase shift well or non-phase shift area), the aforementioned technique may still be carried out with other devices such as SEMs. Even if a SEM is required to identify the defects, the method of the present invention still may be carried out without use of FIBs or laser tools.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, defects could be located manually one at a time using the optical microscope described above. Once the defect is located, the field aperture could then be adjusted, the entire mask then coated with resist, the area encompassed by the field aperture then exposed to ultraviolet light, the resist developed, the SOG material deposited and the defect area etched. Accordingly, the invention is not to be seen as limited by the foregoing description, but is only limited by the scope of the appended claims.

What is claimed as new and desired to be protected by Letters Patent of the United States is:

1. A method for repairing at least one bump or divot defect in an integrated circuit processing phase shift template having phase shift areas and non-phase shift areas, the method comprising the steps of:

locating the at least one defect in said phase shift template;

coating the phase shift template with resist;

exposing the resist in an area corresponding to the at least one defect and areas adjacent to the at least one defect without exposing other areas;

developing the resist so as to uncover the area corresponding to the at least one defect and areas adjacent to the at least one defect;

subsequently, depositing repair material in the areas uncovered in the developing step, such that the repair material covers the at least one defect; and subsequently, removing the repair material and material of the at least one defect to a level approximately equal to a non-defect level of a substrate in the areas adjacent to the defect.

2. The method of claim 1, wherein the repair material is spin-on-glass material.

3. The method of claim 2, further comprising the step of heating the spin-on-glass material.

4. The method of claim 1, wherein the exposing step is repeated for all defects in a first template area type prior to the developing step, the template area type being selected from the group consisting of non-phase shift template areas and phase shift template areas.

5. The method of claim 4, further comprising the steps of repeating the steps recited in claim 1 for all defects in a second template area type, the second template area type being different from the first template area type.

6. The method of claim 1, wherein defects are identified with an optical microscope.

7. The method of claim 1, wherein the resist is photoresist and the exposing step is accomplished by irradiating the resist in an area corresponding to the at least one defect and areas adjacent to the at least one defect with ultraviolet light.

8. The method of claim 7, wherein the ultraviolet light has a wavelength of approximately 365 nm.

9. A method for repairing an integrated circuit processing phase shift template having phase shift areas and non-phase shift areas, the method comprising the steps of:

identifying the location of a defect in said phase shift template;

determining whether the defect is in a phase shift area or a non-phase shift area;

determining whether the defect is to be repaired based on whether the defect is in a phase shift area or non-phase shift area;

coating the phase shift template with resist;

selectively exposing the resist in areas adjacent to the defect if the defect is to be repaired;

developing the resist so as to uncover the defect and areas adjacent to the defect;

subsequently, depositing repair material in the uncovered areas, such that the repair material covers the defect;

measuring the thickness of the repair material in the uncovered areas; and subsequently, etching the repair material and any defect material to a desired level, thereby removing any bump defects and filling any divot defects.

10. The method of claim 9, further comprising the steps of stripping all resist remaining after the etching step.

11. The method of claim 9, wherein the template is a mask.

12. The method of claim 11, wherein the mask comprises quartz and the repair material comprises spin-on-glass material, further comprising the step of heating the spin-on-glass material.

13. The method of claim 9, wherein the steps of identifying the location of the defect and determining whether the defect is in a phase shift or non-phase shift area are performed using an optical microscope.

14. The method of claim 13, further comprising illuminating the template with yellow light.

15. The method of claim 14, wherein the selectively exposing step is also performed using an optical microscope, the optical microscope having an adjustable field aperture and a selectable source of ultraviolet light such that a field encompassed by the field aperture is exposed while areas outside the field are not exposed.

16. The method of claim 9, wherein the depositing step is performed by depositing the repair material in the uncovered areas using a submicron capillary.

17. The method of claim 9, wherein the depositing step is performed by depositing the repair material over the entire template including the uncovered areas.

18. The method of claim 9, further comprising the steps of measuring the thickness of the resist and performing the selectively exposing step for a length of time depending upon the measured thickness of the resist.

19. The method of claim 9, further comprising the step of repeating each step recited in claim 9 to repair defects not previously repaired.

20. The method of claim 19, wherein the resist is photoresist.

21. A method for repairing at least one defect in an integrated circuit processing phase shift template that does not require identification of a defect type, wherein the defect type can be bump or divot and wherein the template includes area types including a phase shift area type and non-phase shift area type, the method comprising the steps of:

identifying the location of the at least one defect in said phase shift template;

positioning an optical microscope over the at least one defect area, the optical microscope having an adjustable field aperture and a configurable light source that can be configured to provide light of a first wavelength that will not expose resist and light of a second wavelength that will expose resist, the light source illuminating only areas encompassed by the field aperture, the light source being configured to provide light at the first wavelength;

coating the phase shift template with resist;

adjusting the field aperture of the microscope such that an area corresponding to the at least one defect and areas adjacent to the at least one defect are encompassed by the field aperture;

reconfiguring the light source to provide light at the second wavelength, thereby exposing the resist in the area corresponding to the at least one defect and the areas adjacent to the at least one defect;

developing the resist, thereby uncovering the areas corresponding to the at least one defect and the areas adjacent to the at least one defect;

subsequently, depositing a repair material in at least the uncovered areas, such that the repair material covers that at least one defect;

subsequently, etching the repair material and any material forming a bump defect to a level corresponding to a non-defect level, thereby removing bump defects and filling divot defects; and removing any remaining resist.

22. The method of claim 21, wherein the first wavelength is approximately 575 nanometers and the second wavelength is approximately 365 nanometers.

23. The method of claim 21, wherein the light source is configured to provide light of the first wavelength by the insertion of a first filter into the path of the light between the light source and the object being viewed with the microscope, and is reconfigured to provide light of the second wavelength by removal of the first filter and insertion of a second filter.

24. The method of claim 23, wherein the repair material is spin-on-glass material.

25. The method of claim 24, further comprising the step of heating the spin-on-glass material prior to etching the spin-on-glass material.

26. The method of claim 25, wherein the positioning, identifying, adjusting and reconfiguring steps are repeated for all defects in a single template area type prior to performing the developing step.

27. The method of claim 26, further comprising repeating each step performed during the repair of defects in the first template area type for all defects in the second template area type.

28. The method of claim 27, wherein the depositing step is performed by depositing the spin-on-glass material in the uncovered areas using a submicron capillary.

29. The method of claim 28, wherein areas of approximately equal size are uncovered by the developing step and a fixed amount of material is deposited over each uncovered area in the depositing step.

30. The method of claim 27, wherein the depositing step is performed by depositing the spin-on-glass material over the entire template including the uncovered areas.

31. The method of claim 21, further comprising the steps of measuring the thickness of the resist in the areas corresponding to the at least one defect and the areas adjacent to the at least one defect and performing the selectively exposing step for a length of time depending upon the measured thickness of the resist.

32. The method of claim 21, wherein the identifying step is performed using an automated mask inspection tool.

33. The method of claim 32, wherein the automated mask inspection tool provides a computer file listing the locations of all defects.

34. The method of claim 33, wherein the positioning step is performed using the computer file.

* * * * *